(12) United States Patent
Hung

(10) Patent No.: US 9,653,374 B2
(45) Date of Patent: May 16, 2017

(54) 3DIC PACKAGE COMPRISING PERFORATED FOIL SHEET

(71) Applicant: Taiwan Semiconductor Manufacturing Company, Ltd., Hsin-Chu (TW)

(72) Inventor: Wensen Hung, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 68 days.

(21) Appl. No.: 14/559,631

(22) Filed: Dec. 3, 2014

(65) Prior Publication Data
US 2015/0084181 A1    Mar. 26, 2015

Related U.S. Application Data
(63) Continuation of application No. 13/762,214, filed on Feb. 7, 2013, now Pat. No. 8,907,472.

(51) Int. Cl.
| | |
|---|---|
| *H01L 23/34* | (2006.01) |
| *H01L 23/367* | (2006.01) |
| *H01L 21/50* | (2006.01) |
| *H01L 23/10* | (2006.01) |
| *H01L 23/36* | (2006.01) |
| *H01L 23/373* | (2006.01) |
| *H01L 23/42* | (2006.01) |
| *H01L 23/427* | (2006.01) |
| *H01L 23/473* | (2006.01) |
| *H01L 23/31* | (2006.01) |

(52) U.S. Cl.
CPC .......... *H01L 23/3672* (2013.01); *H01L 21/50* (2013.01); *H01L 23/10* (2013.01); *H01L 23/34* (2013.01); *H01L 23/36* (2013.01); *H01L 23/373* (2013.01); *H01L 23/42* (2013.01); *H01L 23/4275* (2013.01); *H01L 23/473* (2013.01); *H01L 23/3128* (2013.01); *H01L 2224/16* (2013.01); *H01L 2924/15311* (2013.01)

(58) Field of Classification Search
CPC ... H01L 23/36; H01L 23/367; H01L 23/3672; H01L 23/42; H01L 23/10
USPC .................................................. 257/713, 720
See application file for complete search history.

(56) References Cited

U.S. PATENT DOCUMENTS

| | | | | |
|---|---|---|---|---|
| 5,528,456 | A | * | 6/1996 | Takahashi ........... H01L 23/3675 165/185 |
| 5,909,057 | A | * | 6/1999 | McCormick .......... H01L 21/563 257/680 |
| 6,097,598 | A | | 8/2000 | Miyahara et al. |
| 6,317,326 | B1 | * | 11/2001 | Vogel .................... H01L 23/473 165/80.4 |

(Continued)

FOREIGN PATENT DOCUMENTS

| | | |
|---|---|---|
| CN | 101930952 A1 | 12/2010 |
| CN | 102683302 A | 9/2012 |

*Primary Examiner* — Jerome Jackson, Jr.
*Assistant Examiner* — John Lin
(74) *Attorney, Agent, or Firm* — Slater Matsil, LLP

(57) ABSTRACT

A structure includes a thermal interface material, and a Perforated Foil Sheet (PFS) including through-openings therein, with a first portion of the PFS embedded in the thermal interface material. An upper layer of the thermal interface material is overlying the PFS, and a lower layer of thermal interface material is underlying the PFS. The thermal interface material fills through-openings in the PFS.

20 Claims, 24 Drawing Sheets

(56) References Cited

U.S. PATENT DOCUMENTS

| | | |
|---|---|---|
| 6,523,608 B1 | 2/2003 | Solbrekken et al. |
| 7,122,891 B2 | 10/2006 | Dishongh et al. |
| 7,145,232 B2 | 12/2006 | Parthasarathy et al. |
| 7,200,006 B2 | 4/2007 | Farrow et al. |
| 7,995,344 B2 | 8/2011 | Dando, III et al. |
| 8,034,662 B2 | 10/2011 | Touzelbaev et al. |
| 8,076,771 B2 | 12/2011 | Ando |
| 8,581,374 B1 | 11/2013 | Chen et al. |
| 8,659,135 B2 | 2/2014 | Bauer et al. |
| 2002/0015288 A1 | 2/2002 | Dibene, II et al. |
| 2004/0099944 A1 | 5/2004 | Kimura |
| 2005/0017350 A1 | 1/2005 | Corti et al. |
| 2010/0237496 A1 | 9/2010 | Touzelbaev et al. |

\* cited by examiner

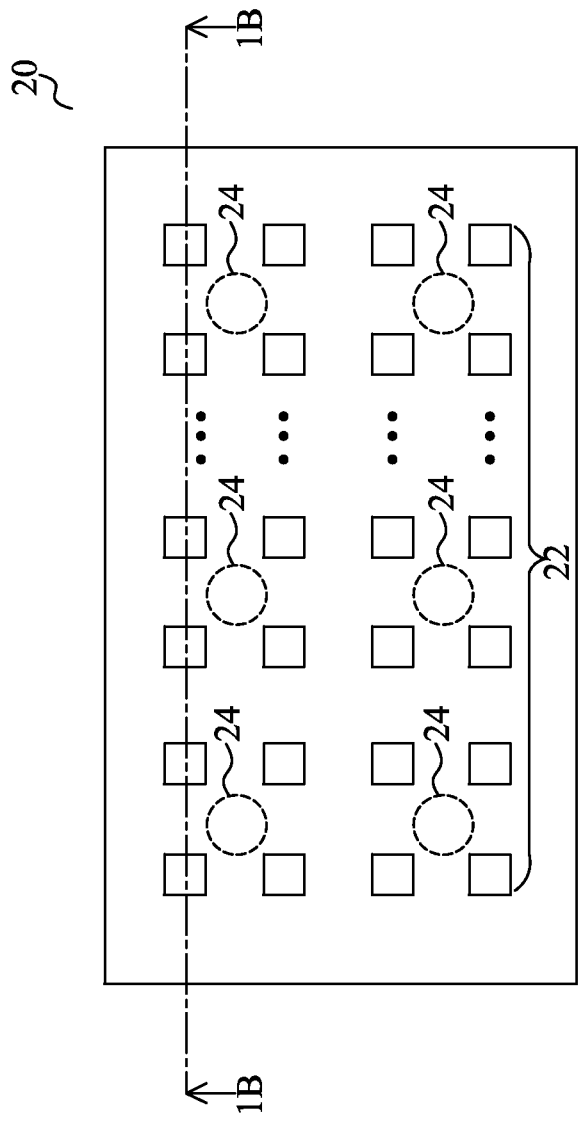
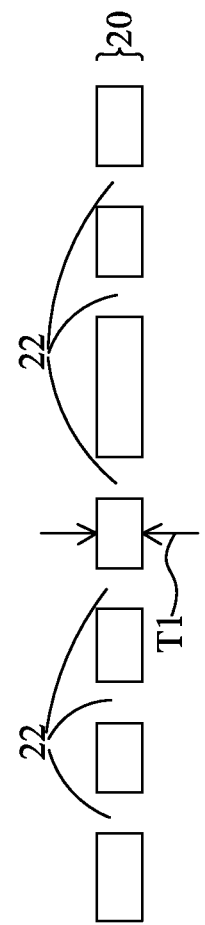
Fig. 1A
Fig. 1B

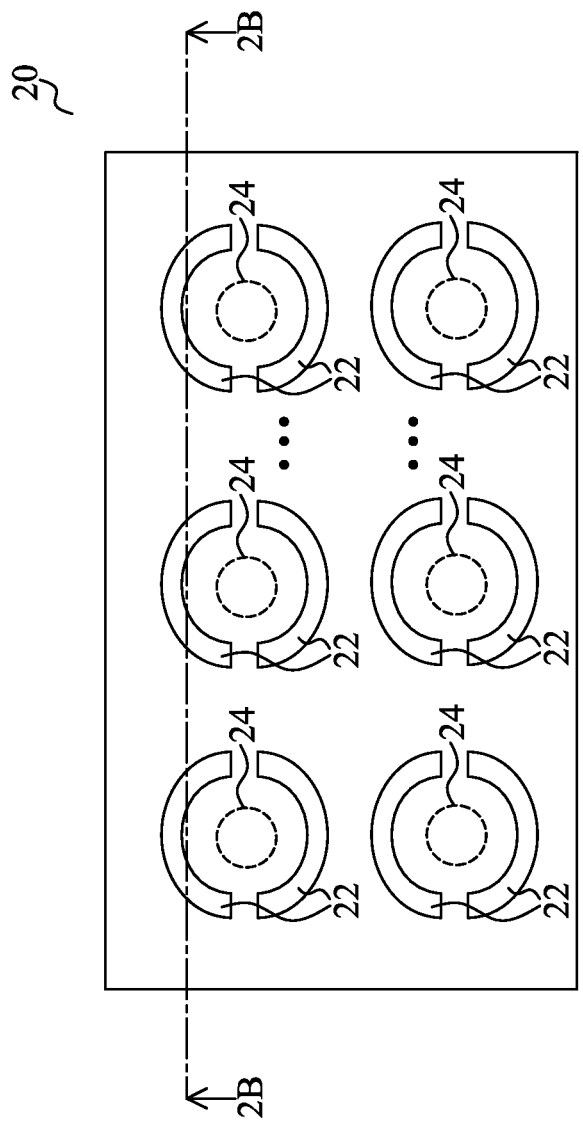
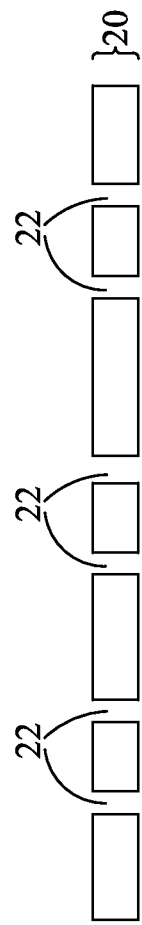
Fig. 2A
Fig. 2B

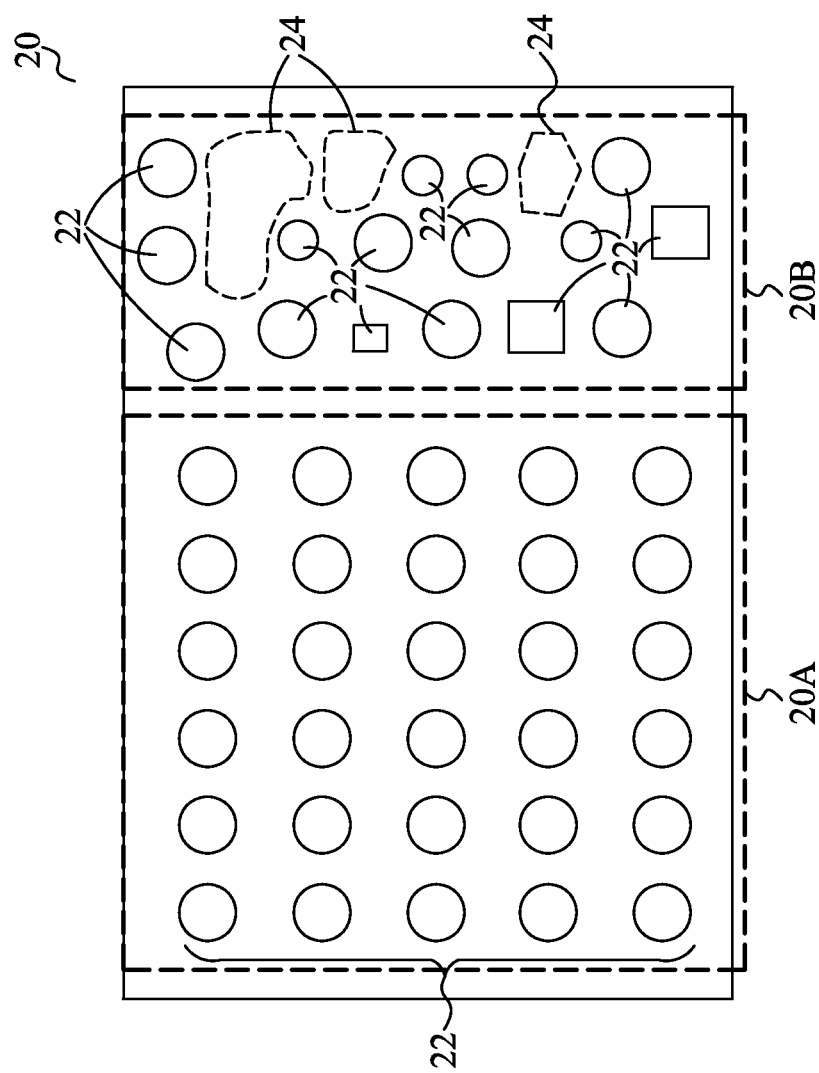

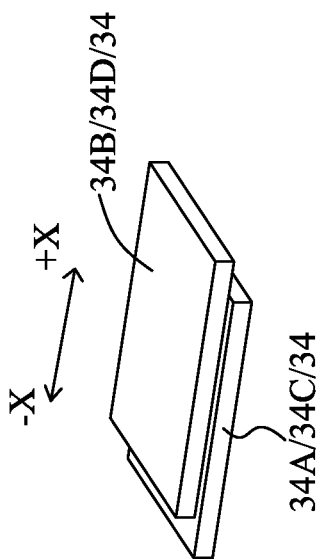
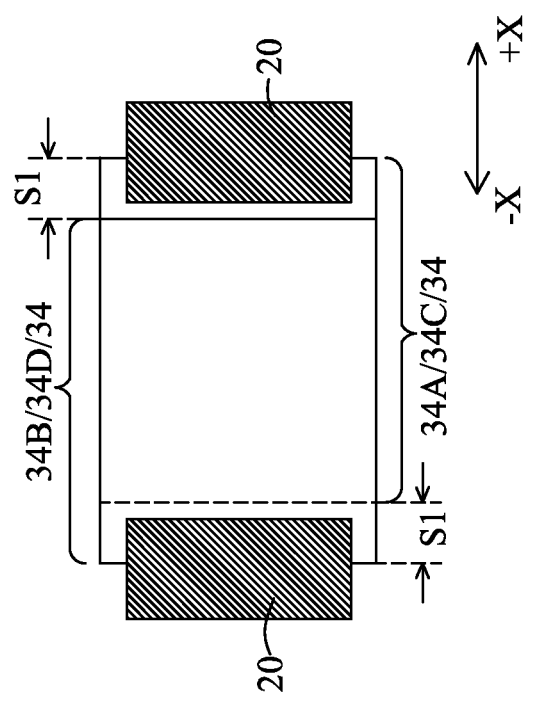
Fig. 16C
Fig. 16B

3DIC PACKAGE COMPRISING PERFORATED FOIL SHEET

PRIORITY CLAIM AND CROSS-REFERENCE

This application is a continuation of U.S. patent application Ser. No. 13/762,214, entitled "3DIC Package Comprising Perforated Foil Sheet," filed on Feb. 7, 2013, which application is incorporated herein by reference.

BACKGROUND

In Three-Dimensional Integrated Circuits (3DIC), devices dies are either bonded on interposers, package substrates, or stacked on other device dies. Although the performance of the respective circuits is improved, the heat dissipation becomes a more significant concern. Conventionally, the heat in device dies is dissipated to the overlying heat sink through a Thermal Interface Material (TIM) layer, which adheres the heat sink to the underlying device dies. The thermal conductivity of the TIM, however, is not satisfactory. Hence, the heat dissipation through the TIM becomes a bottle neck for improving the heat dissipation.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1A through 3 are top views and cross-sectional views of Perforated Foil Sheets (PFS) in accordance with some exemplary embodiments;

FIGS. 16A through 16E illustrate a cross-sectional view, top views, and perspective views of some packages in accordance with some embodiments;

DETAILED DESCRIPTION OF ILLUSTRATIVE EMBODIMENTS

Figure 4:
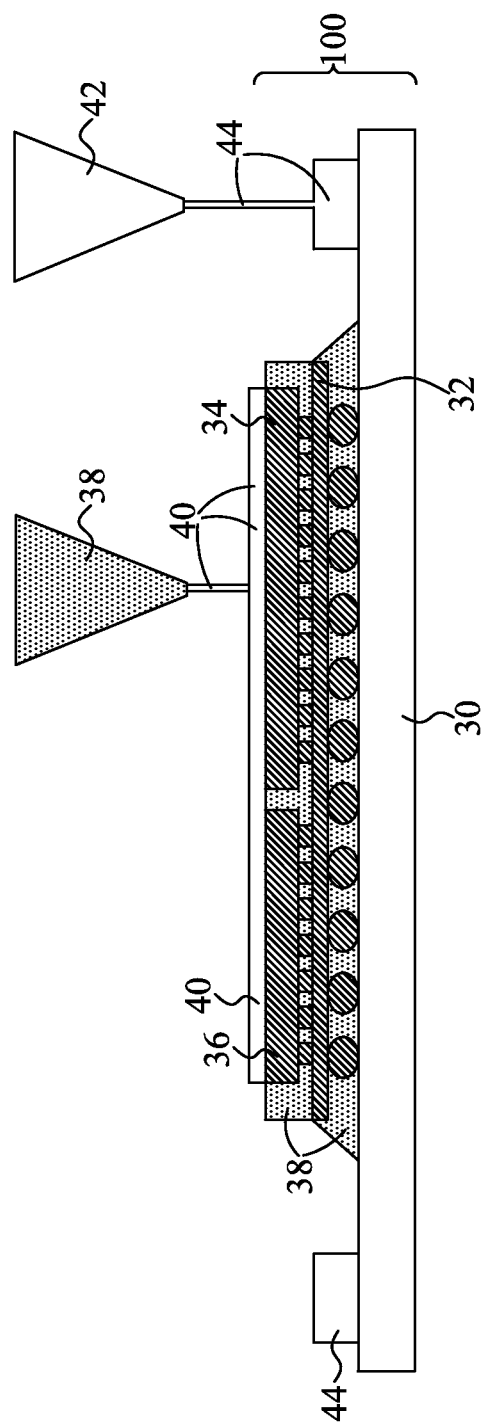
FIGS. 4 through 8 are cross-sectional views of intermediate stages in the manufacturing of a package in accordance with some exemplary embodiments, wherein a PFS is embedded in the package.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A package including a Perforated Foil Sheet (PFS) and the method of forming the same are provided in accordance with various exemplary embodiments. The intermediate stages of forming the package are illustrated. The variations of the packages in accordance with alternative embodiments are discussed. Throughout the various views and illustrative embodiments, like reference numbers are used to designate like elements.

FIGS. 1A and 1B illustrate a top view and a cross-sectional view, respectively, of PFS 20, wherein the cross-sectional view in FIG. 1B is obtained from the plane crossing line 1B-1B in FIG. 1A. Referring to FIG. 1A, PFS 20 is a sheet (a film) including through-openings 22 therein. The material of PFS 20 has a good thermally conductivity, which may be greater than about 20 W/m*K, greater than about 50 W/m*K, greater than about 100 W/m*K, or greater than about 350 W/m*K. The exemplary materials of PFS 20 include, and are not limited to, graphite, Cu, Pt, Ni, silver, alloys thereof, and multi-layers thereof. For example, graphite may have a thermal conductivity greater than about 700 W/m*K, or as high as about 1,750 W/m*K. Thickness T1 (FIG. 1B) of PFS 20 may be between about 10 μm and about 50 μm. It is appreciated, however, that the values recited throughout the description are merely examples, and may be changed to different values.

As shown in FIG. 1A, PFS 20 is a continuous sheet, although there are openings therein. Accordingly, the heat in one portion of PFS 20 may be dissipated to other portions easily. For example, the heat in portions 24, which have temperatures higher than other portions of PFS 20, may be dissipated to surrounding portions.

FIG. 2A illustrates PFS 20 in accordance with alternative embodiments, wherein openings 22, instead of having the rectangular top-view shape as in FIG. 1A, have arc shapes. In yet other embodiments, PFS 20 may have any other applicable shapes including, and not limited to, triangle, hexagons, octagons, circles, and the like.

Openings 22 in PFS 20 may, or may not, be identical to each other, and may be allocated in any layout. For example, FIGS. 1A and 2A illustrate that openings 22 are allocated with a repeated pattern, and may form an array. FIG. 3 illustrates that openings 22 may have sizes and/or shapes same as, or different from, each other. In some embodiments, some portions of PFS 20, for example, portion 20A, may have uniformly distributed openings 22, while some other portions such as portion 20B may have non-uniformly distributed openings 22. In some exemplary embodiments, when embedded in packages, PFS portion 20A does not overlap hot spots (regions hotter than other regions) of the underlying device dies 34 and 36 (FIGS. 8 through 12), while PFS portion 20B overlaps the hot spots of the underlying device dies 34 and 36. In PFS portion 20B, the density and the location of openings 22 may also be adjusted according to the distribution of the hot spots in the underlying device dies. For example, in the PFS portions that are directly over the hot spots of device dies 34 and 36, the density of openings 22 is smaller, and PFS 20 may not include any opening in the portions (illustrated as portions 24 in FIG. 3) overlapping the hot spots. In alternative embodiments, portions 20A and 20B may have a same distribution of openings 22.

FIGS. 4 through 8 illustrate cross-sectional views of intermediate stages in the formation of a package in accordance with exemplary embodiments. Referring to FIG. 4, package components 30, 32, 34, and 36 are bonded to form a part of package 100. In some exemplary embodiments, package component 30 is a package substrate, which may be a built-up substrate or a laminate substrate. Package component 32 may be an interposer, which includes a dielectric substrate or a semiconductor substrate (such as a silicon substrate). Conductive redistribution lines (not shown) are formed in each of package components 30 and 32 to electrically inter-couple the conductive features on opposite sides of the respective package components 30 and 32. Dies 34 and 36 may be device dies that include active devices such as transistors. In some embodiments, die 34 is a logic die, and die 36 is a memory die, although device dies 34 and 36 may be other types of dies in any combination. Molding material 38 molds package components 34, 36, and 32 therein. The top surfaces of dies 34 and 36 may be exposed.

As also shown in FIG. 4, dispenser 42 dispenses Thermal Interface Material (TIM) 40 on to the top surfaces of dies 34 and 36. TIM 40 has a relatively higher thermal conductivity (hence the name) than typical adhesive materials. In some embodiments, TIM 40 has a thermal conductivity between about 3 W/m*K and about 8 W/m*K, although its thermal conductivity may also be slightly higher or lower. The thermal conductivity of TIM 40, however, is still much lower than that of PFS. For example, the thermal conductivity of PFS 20 may be greater than about 5 times, 20 times, 50 times, or about 100 times the thermal conductivity of TIM 40. TIM 40 may comprise an organic material, and may also act as an adhesive. In some embodiments, TIM 40 comprises a polymer matrix, a phase change polymer, a silicone-based matrix, a matrix additive (fluxing agent), a filler material (a metallic core with an organic solderability preservative coating), or the like. TIM 40 is dispensed in a liquid form that has a high viscosity.

Figure 6:
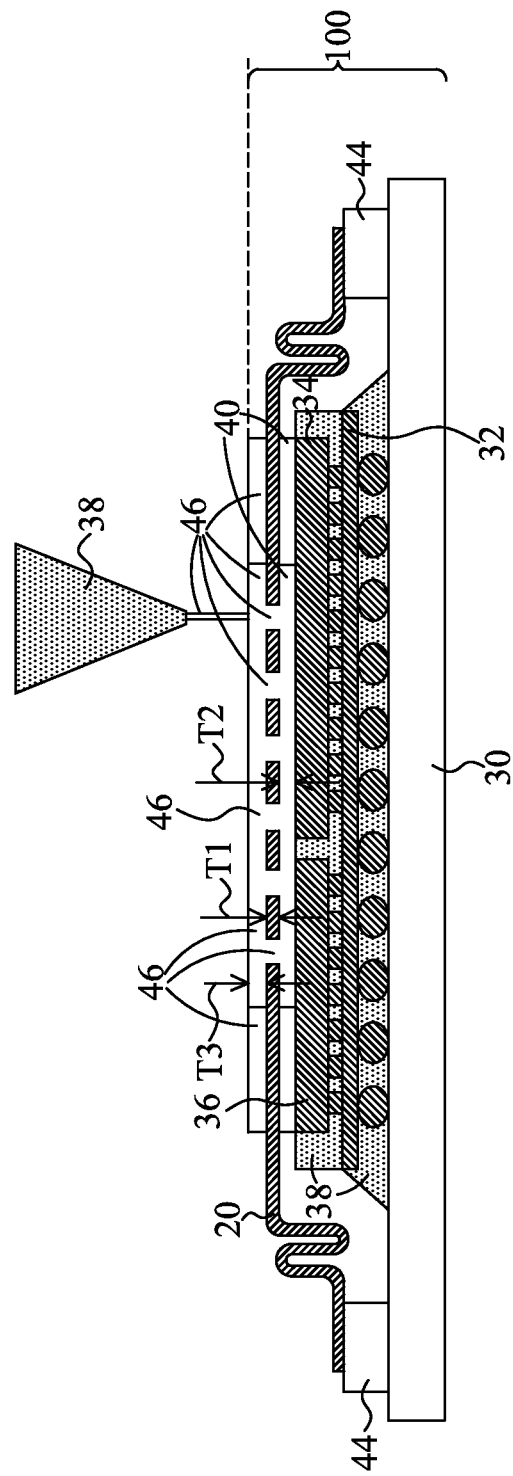

After the dispensing, TIM 40 is fully cured or partially cured. In the embodiments that TIM 40 has a very high viscosity, it may not be cured at this stage. Instead, it may be cured after TIM 46 is dispensed (FIG. 6). FIG. 4 also illustrates the dispensing of adhesive 44 through dispenser 42, which may be cured after dispensing. Alternatively, adhesive 44 may be an adhesive tape. Adhesive 44 may also be a TIM in accordance with some embodiments.

Figure 5:
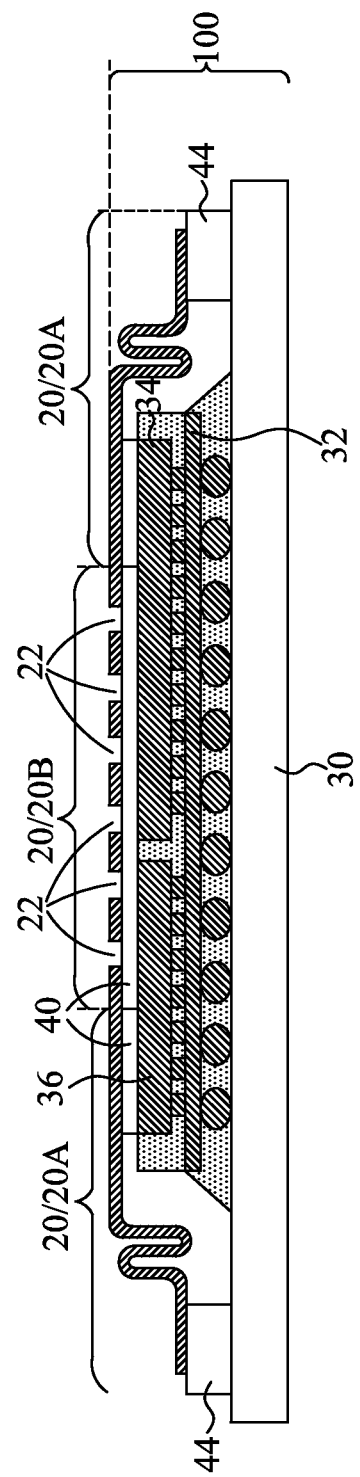

Next, referring to FIG. 5, PFS 20 is disposed, with portion 20B (FIG. 3) of PFS 20 on TIM 40. In some embodiments, PFS 20 includes portions 20A extending beyond TIM 40, and hence portions 20A of PFS 20 do not overlap TIM 40. Portions 20A and 20B are also illustrated and discussed referring to FIG. 3. Some openings 22 are illustrated as overlapping TIM 40. Although not shown, PFS 20 may, or may not, include openings 22 in portion 20A. Furthermore, PFS 20 may also extend on adhesive 44.

Referring to FIG. 6, TIM 46 is dispensed over TIM 44 and PFS 20. TIM 46 is also filled into openings 22, and hence joins TIM 40 through openings 22. In the resulting structure, PFS 20 is embedded inside the combined TIM region that includes TIMs 40 and 46. Although TIMs 40 and 46 are illustrated as covering parts of dies 34 and 36, TIMs 40 and 46 may also cover entireties of dies 34 and 36. TIM 46 may comprise a material that is selected from the same group of candidate materials of TIM 40. Furthermore, TIMs 40 and 46 may comprise the same material, or different materials. Each of thicknesses T2 and T3 of TIMs 40 and 46, respectively, may be between about 20 percent and about 200 percent of thickness T1 of PFS 20.

In the illustrative embodiments, PFS 20 has overlying TIM 46 and underlying TIM 40. In alternative embodiments, PFS 20 may be in contact with one of device dies 34 (or 36) and lid 58 (FIG. 8), and one of TIMs 40 and 46 is formed, while the other is not formed.

Figure 15C:
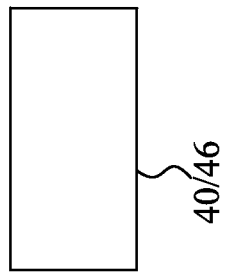
FIGS. 15A, 15B, and 15C illustrate a heavily loaded Thermal Interface Material (TIM), a lightly loaded TIM, and an unloaded TIM, respectively.
Figure 15B:
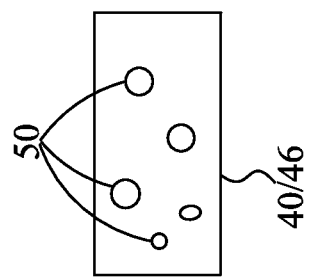
Figure 15A:
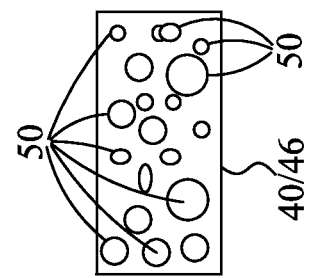

TIMs 40 and/or 46 may include filler particles 50 therein, as shown in FIGS. 15A and 15B, or may be free from particles, as shown in FIG. 15C. FIG. 15A illustrates TIM 40 or 46 that is heavily loaded with filler particles 50, wherein filler particles 50 may have a volume percentage between about 50 percent and about 80 percent in the total volume of TIM 40 or 46. FIG. 15B illustrates TIM 40 or 46 that is lightly loaded with filler particles 50, wherein filler particles 50 may have a volume percentage between about 10 percent and about 50 percent in the total volume of TIM 40 or 46. FIG. 15C illustrates TIM 40 or 46 that is not loaded with filler particles. Filler particles 50 may be silicon particles, aluminum (Al) particles, aluminum oxide ($Al_2O_3$) particles, silver (Ag) particles, or the like. Heavily loaded TIMs 40 and 46 have improved thermal conductivity values over that of lightly loaded TIMs and unloaded TIMs since the filler particles 50 have a high thermal conductivity. The thickness of the heavily loaded TIMs, however, is difficult to reduce, while thicker TIMs have reduced thermal conducting ability. On the other hand, although unloaded TIMs 40 or 46 has a thermal conductivity value lower than that of lightly loaded TIMs and heavily loaded TIMs, it may be made thinner, and thinner TIMs have improved thermal conducting ability. Accordingly, the loading of TIMs 40 and 46 needs to be balanced to achieve optimum thermal conductivity.

Figure 7:
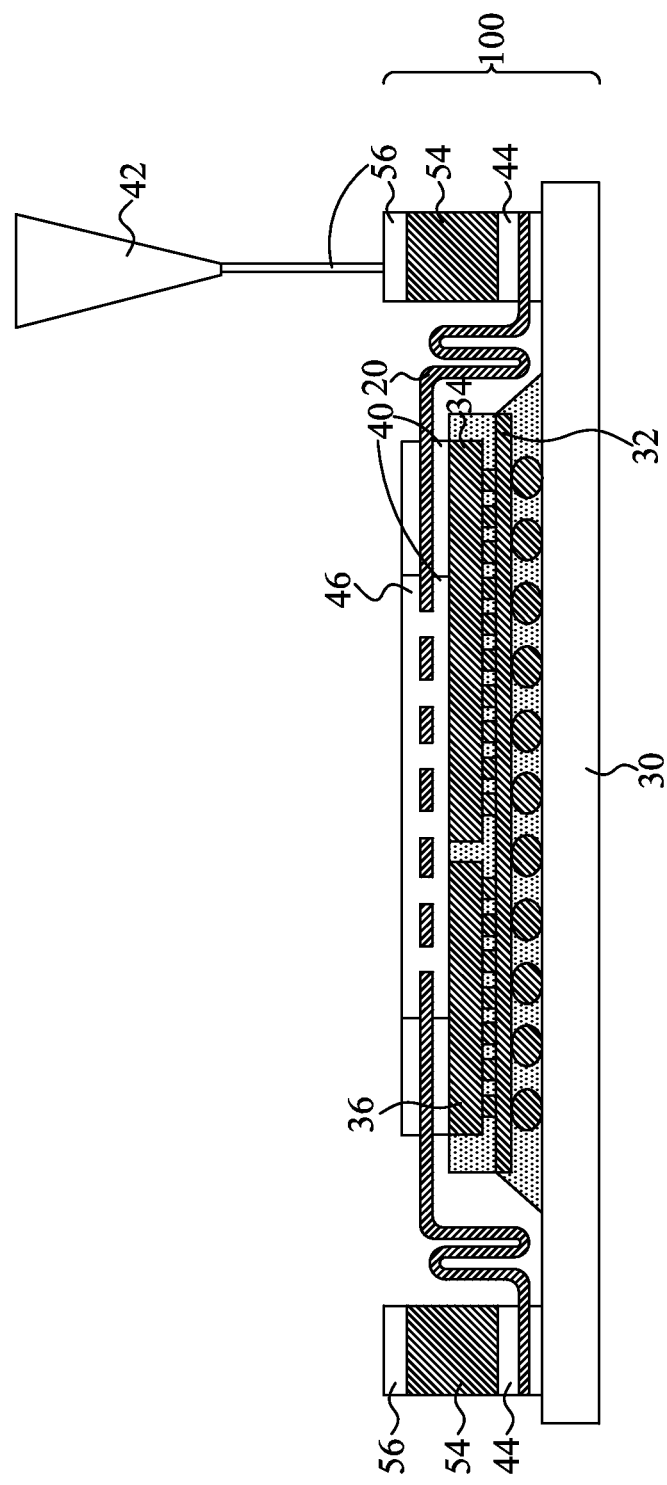

Next, as shown in FIG. 7, additional adhesive 44 is dispensed on the ends of PFS 20 to embed it therein. Accordingly, the opposite ends of PFS 20 are secured in adhesive 44. Ring 54, which is thermally conductive, and may be formed of metals such as copper, aluminum, or the like, is mounted over adhesive 44. Ring 54 may have a ring shape in the top view of FIG. 7, and may be a full ring or a partial ring. Adhesive 56 is further dispensed over ring 54 using dispenser 42. In some embodiments, adhesives 44 and 56 may also comprise TIMs.

Figure 8:
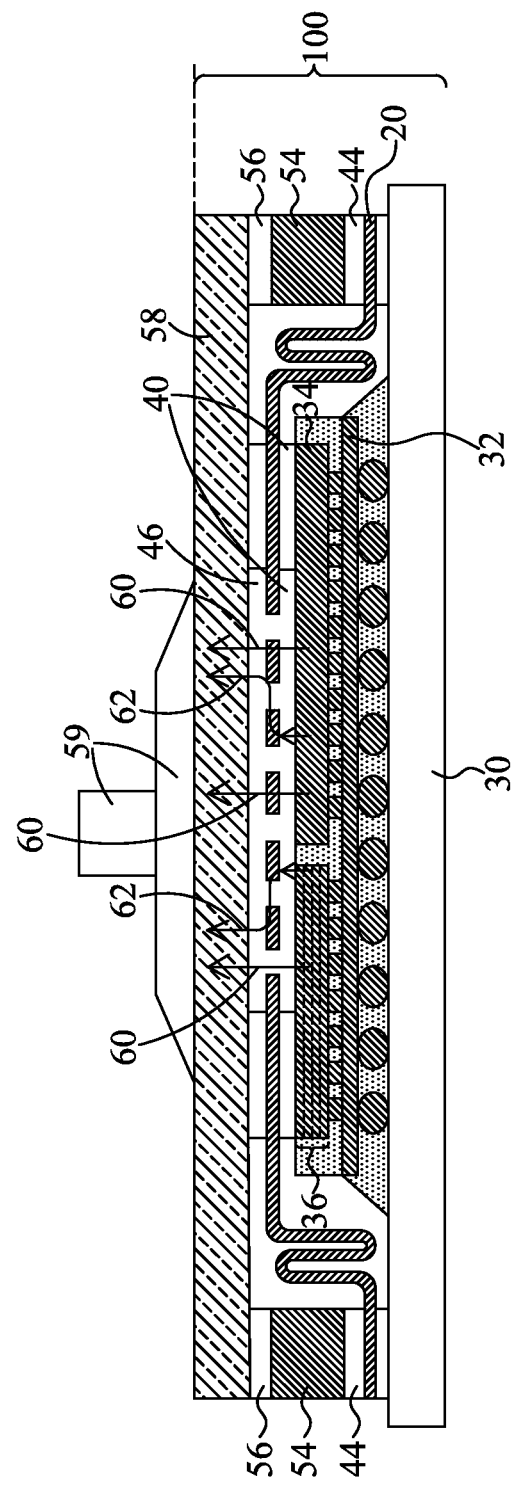

FIG. 8 illustrates the mounting of lid 58 using suction head 59, which picks up lid 58 through vacuuming, and places lid 58 over TIM 46 and adhesive 56. Lid 58 may be formed of a metal or a metal alloy that has a high thermal conductivity. A pressure may be applied to ensure the good contact of lid 58 to both TIM 46 and adhesive 56. The pressure may also be used to reduce the thickness of TIM 46 (and TIM 40 if it has not been fully cured yet). A curing step is then performed to cure TIM 46 (and possibly TIM 40) and adhesive 56, so that lid 58 is adhered to TIM 46 and adhesive 56. Suction head 59 is then removed.

In some embodiments, each of dies 34 and 36 is a single die. In alternative embodiments, as illustrated by dashed lines, one or both of dies 34 and 36 may be replaced by a plurality of stacked dies. Furthermore, although dies 34 and 36 are illustrated, there may be more dies bonded to package component 32. In the operation of dies 34 and 36 when they are powered on, heat is generated in dies 34 and 36. The heat is conducted upwardly to lid 58 through TIMs 40 and 46 and PFS 20, as illustrated by arrows 60. In addition, since PFS 20 has good thermal conductivity, the portions (portions 24 in FIGS. 1A, 2A, and 3) of PFS 20 that are directly over the hot spots of dies 34 and 36 receive more heat than other portions of PFS 20. The heat in portions 24 is also conductive horizontally to other portions of PFS 20, and then to lid 58 (as illustrate by arrows 62) or ring 54. Accordingly, the heat dissipation of package 100 is improved.

PFS 20 may be customized according to the sizes of dies 34 and 36, and according to the positions of the hot spots in dies 34 and 36. As shown in FIG. 3, the locations of openings 22 in PFS 20 may be allocated according to the hot spots of dies 34 and 36, so that the density of openings 22 in the portions 24 of PFS 20 overlapping the hot-spot-dense regions is relatively low, and the density of openings 22 in the portions of PFS 20 not overlapping the hot-spot-dense regions is relatively high. Furthermore, the design of PFS 20 may be customized to ensure that portions 24, which are directly over the hot spots in dies 34 and 36, do not include openings 22. In the step shown in FIG. 5, PFS 20 is aligned to the hot spots of dies 34 and 36 correspondingly.

FIGS. 9 through 12 illustrate package 100 in accordance with alternative embodiments. Unless specified otherwise, the materials and formation methods of the components in these embodiments are essentially the same as the like components, which are denoted by like reference numerals in the embodiments shown in FIGS. 1A through 8. The details regarding the formation process and the materials of the components shown in FIGS. 9 through 12 may thus be found in the discussion of the embodiments shown in FIGS. 1A through 8.

Figure 9:
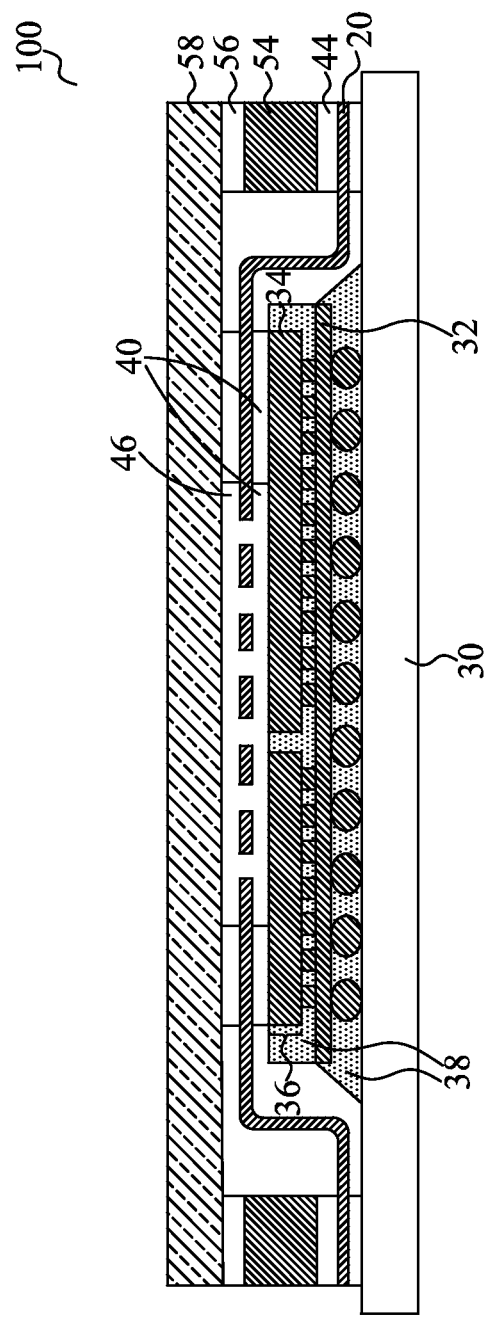
FIGS. 9 through 12 illustrate the cross-sectional views of packages in accordance with some exemplary embodiments, wherein the PFSs are embedded in the packages.
Figure 10:
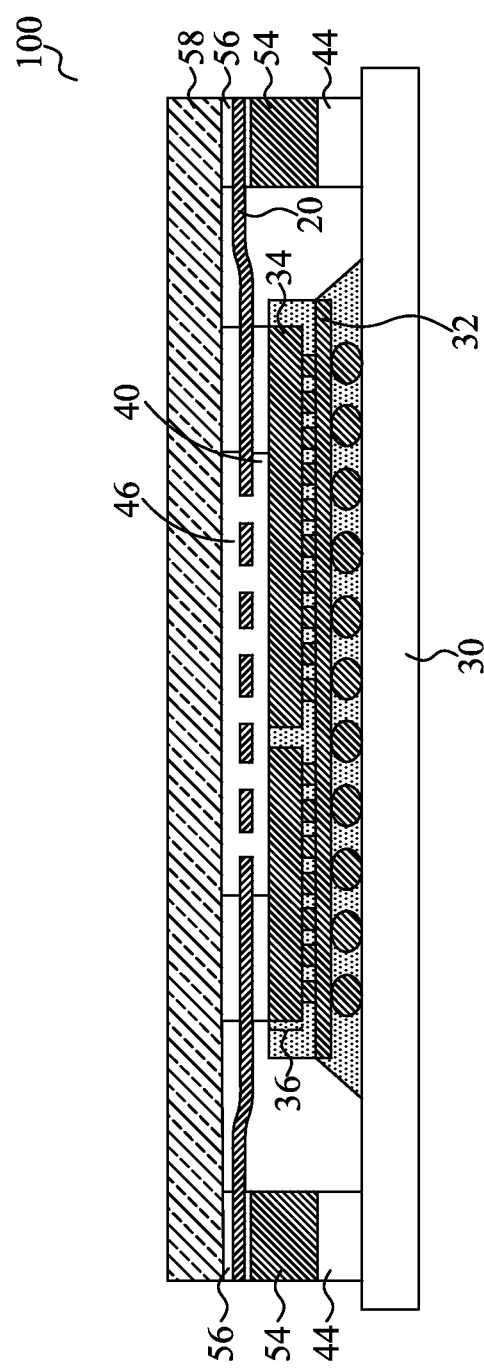
Figure 11A:
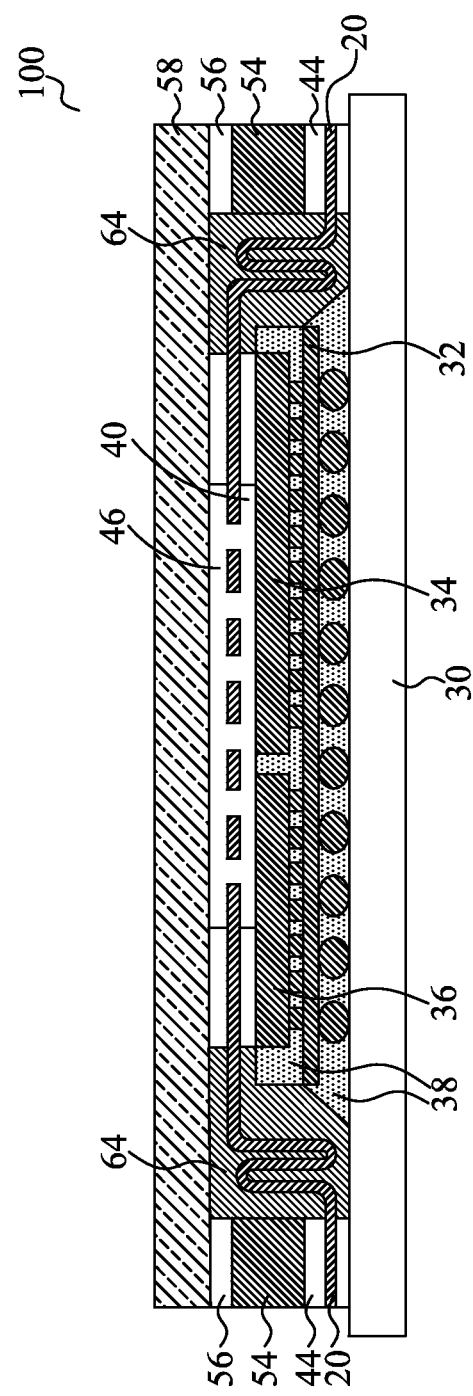

FIG. 8 illustrates the embodiments wherein PFS 20 includes a plurality of up-and-down curls to increase its thermal conductivity through air. FIG. 9 illustrates that PFS 20 does not have additional curls. The ends of PFS 20 are embedded in adhesive 44 that is underlying ring 54. FIG. 10 illustrates that the ends of PFS 20 are embedded in adhesives 56, rather than in adhesives 44. FIG. 11A is similar to the embodiments in FIG. 8, except that molding material 64 is dispensed in ring 54. Molding material 64 also embeds portions 20A of PFS 20 therein. Molding material 64 may be a molding compound or a molding underfill, for example. By adding molding material 64, the strength of package 100 is improved, and PFS 20 suffers less from damage. In the embodiments in FIGS. 8 through 11A, heat may also be conducted to lid 58 through adhesive 44 and possibly ring 54.

Figure 11B:
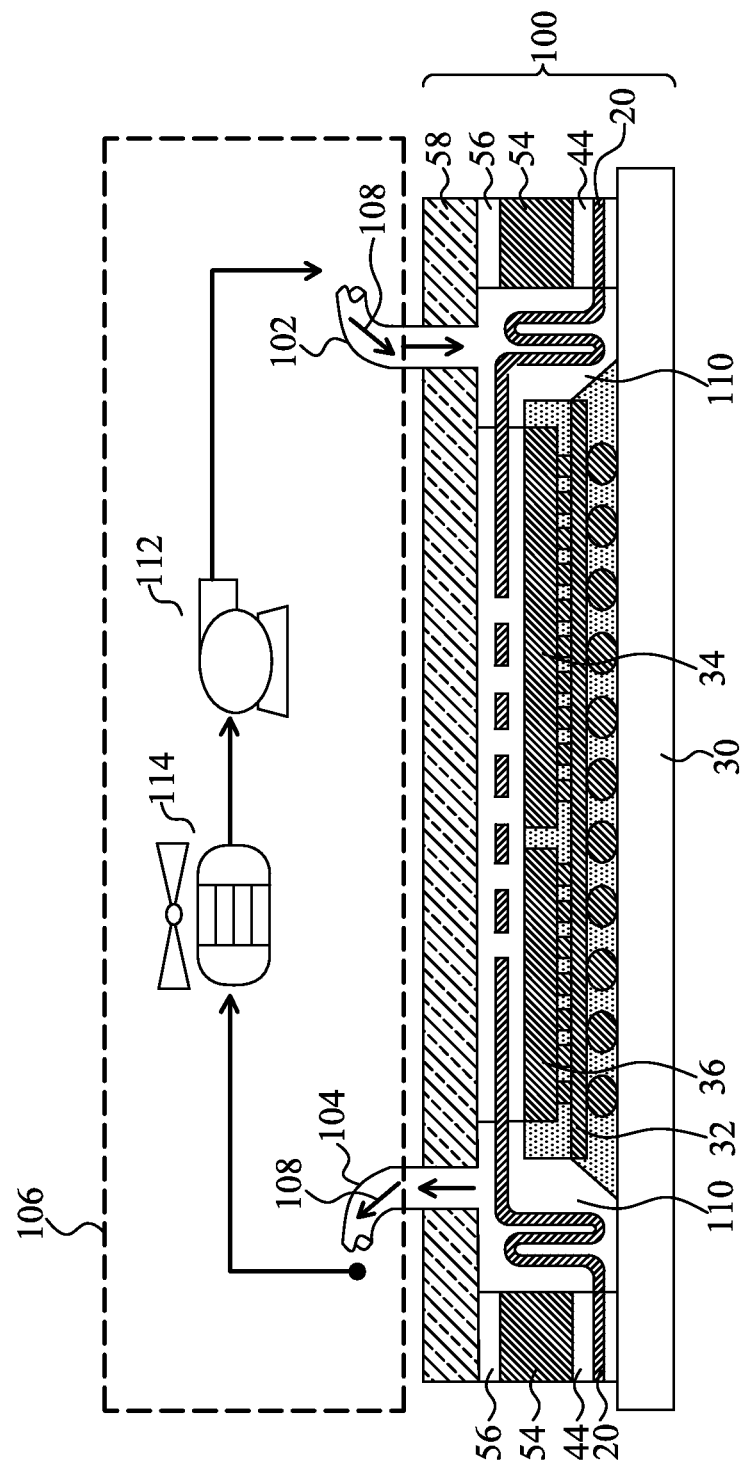

FIG. 11B illustrates package 100 in accordance with alternative embodiments. These embodiments are similar to the embodiments in FIG. 11A, except that no molding material is dispensed in space 110, which is encircled by ring 54. Inlet 102 and outlet 104 are connected to space 110 from outside. Inlet 102 and outlet 104, which may include pipes, are parts of pumping system 106. Through pumping system 106, coolant 108 may be pumped into space 110 by pump 112, absorb the heat from PFS 20, and pumped out of space 110. The heat carried by coolant 108 may be retrieved out of coolant 108 through heat exchanger 114. Coolant 108 may be non-electrical conductive, and may be, for example, de-ionized water, oil, or the like. Although pumping system 106 is illustrated in FIG. 11B, pumping system 106 may also be used in other package structures of the present disclosure, including, and not limited to, the package structures shown in FIGS. 9, 10, and 19.

Figure 12:
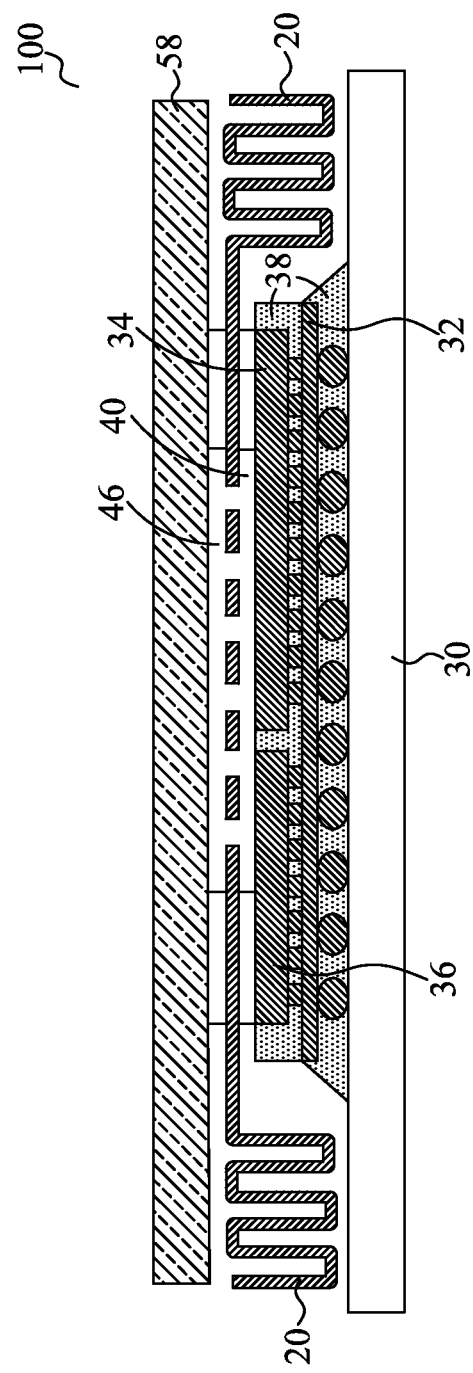
Figure 13C:
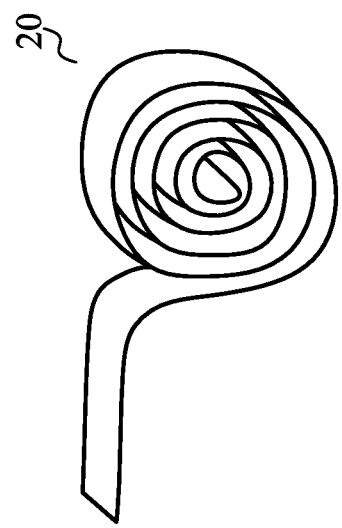
FIGS. 13A through 13C illustrate perspective views of some exemplary PFS coils.
Figure 13B:
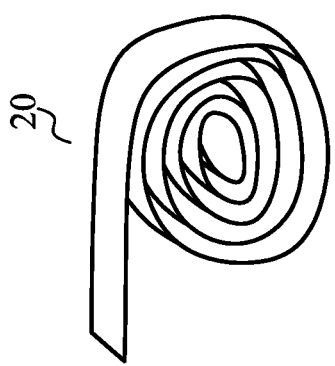
Figure 13A:
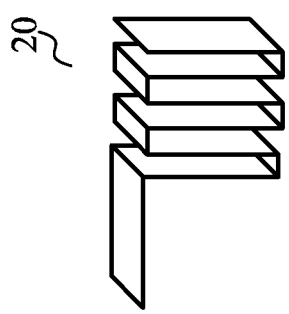

FIG. 12 illustrates embodiments wherein none of ring 54 and adhesives 44/56 is formed. Accordingly, the ends of PFS 20 may be suspended (and not fixed) in accordance with some embodiments. FIGS. 13A, 13B, and 13C illustrate the perspective views of some exemplary PFS 20 that may be used in the embodiments in FIG. 12. In FIG. 13A, the curls of PFS 20 has a repeated up-and-down pattern, and which curls in combination are sometimes referred to a Manhattan curl. FIGS. 13B and 13C illustrate clockwise and counter clockwise curls, respectively.

In the embodiments in FIGS. 8 and 12, a single PFS 20 is included in each of packages 100. In alternative embodiments, the illustrated PFS 20 may include a plurality of discrete PFS 20, wherein one end of each of the plurality of PFS 20 is embedded in TIMs 40 and 46. The other ends of the plurality of discrete PFS 20 may either be embedded in adhesives 44 or 56, or may be suspended.

FIGS. 14 and 15 illustrate composite PFS 20 that include two or more sub layers formed of different thermal conductive materials. For clarity, openings 22 are not shown in composite PFS 20, although through-openings 22 also exist. In some embodiments, PFS 20 includes layer PFS-B that has a good flexibility, and layer PFS-A that has a good thermal conductivity. The flexibility of layer PFS-B is better than the flexibility of layer PFS-A. The thermal conductivity of layer PFS-A is better than the thermal conductivity of layer PFS-B. For example, layer PFS-B may comprise graphite, and layer PFS-A may comprise copper. By combining layers PFS-A and PFS-B, PFS 20 may have a good thermal conductivity, while still has enough flexibility, and hence is not easily broken when bended.

Figure 14A:
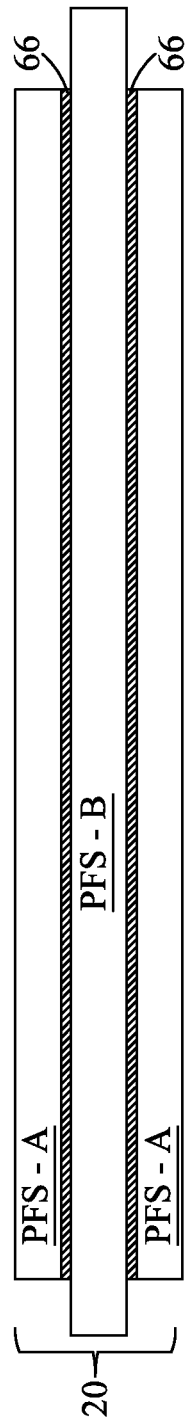
FIGS. 14A and 14B illustrate cross-sectional views of some exemplary composite PFSs.
Figure 14B:
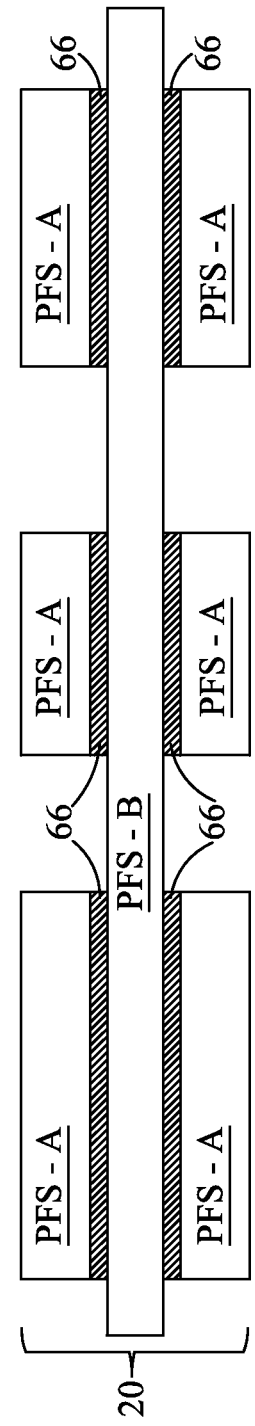

In FIG. 14A, PFS layers PFS-A are formed on opposite sides of layer PFS-B, and may be adhered to layer PFS-B through adhesive layers 66. In alternative embodiments, layer PFS-A is formed on one side, and not on the other side, of layer PFS-B. FIG. 14B is similar to the embodiments in FIG. 14A, except that layers PFS-A are separated into discrete regions. As a result, when PFS 20 is bended, the portions of layer PFS-B having no portions of layer PFS-A formed on opposite sides may be bended first, and hence smaller bending forces are applied on layers PFS-A.

Figure 16A:
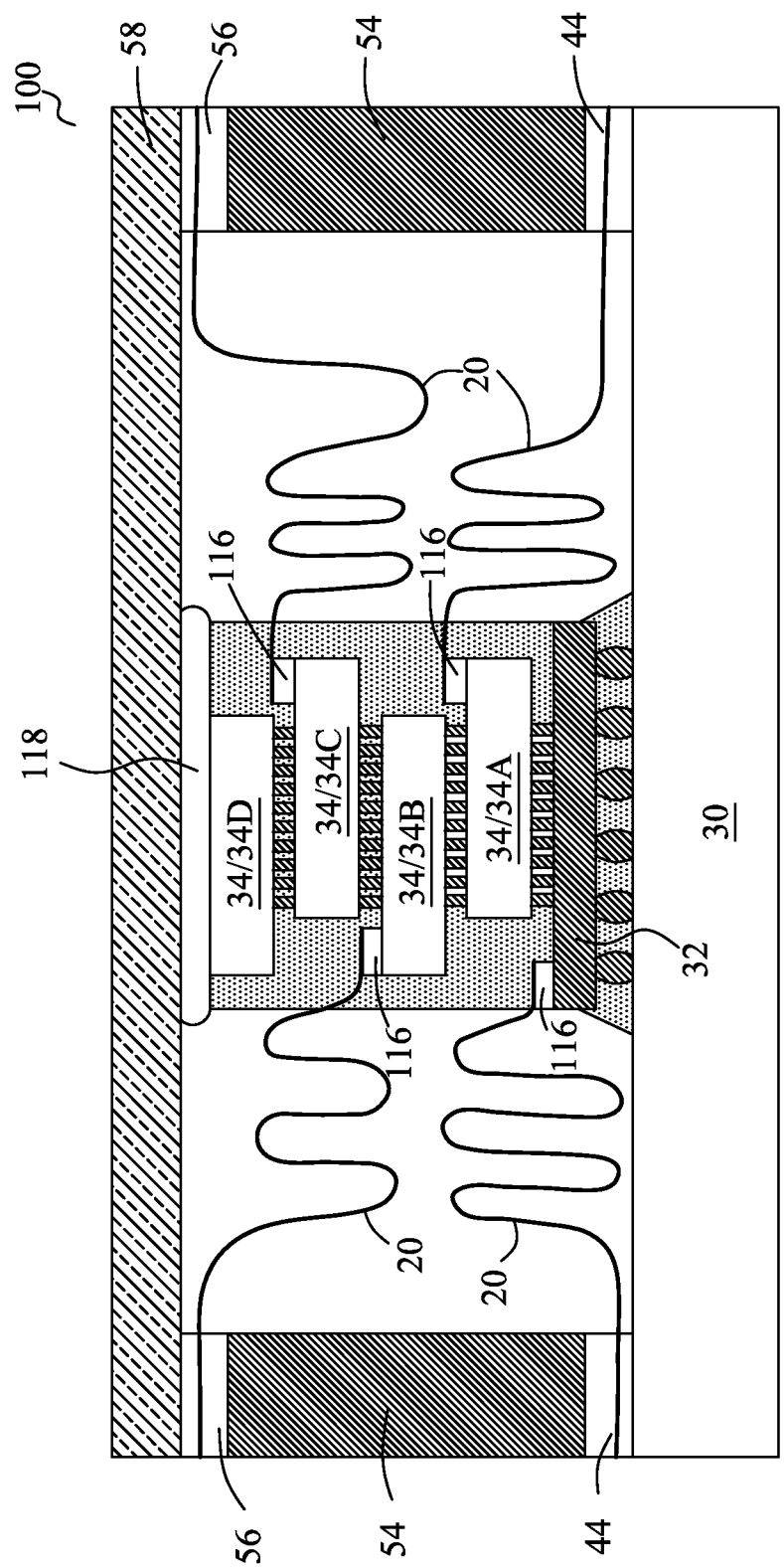

FIGS. 16A through 16E illustrate a cross-sectional view, top views, and perspective views of package 100 in accordance with various embodiments. Referring to FIG. 16A, package 100 includes a plurality of package components 34 (marked as 34A, 34B, 34C, and 34D) stacked on and bonded to package component 32. Package component 32 may be stacked on package component 30. Package components 34 may be device dies, packages, or the like. Package components 32 and 30 may include an interposer and a printed circuit board, respectively, in some exemplary embodiments. Each of package components 32 and 34 may be connected to one PFS 20, so that the heat in the respective package components may be conducted to lid 58 through PFSs 20, ring 54, and adhesive 56.

Package components 32 and 34 may conduct heat to PFSs 20 through, for example, metal pads 116, which are formed on the surfaces of package components 32 and 34. Top package component 34D may be adhered to lid 58 through TIM 118. With the structure in FIG. 16A, more heat conduction paths are provided through a plurality of PFSs 20, and good heat dissipation is achieved.

FIGS. 16B and 16C illustrate some examples for stacking package components 34, wherein FIGS. 16B and 16C include a top view and a perspective view, respectively. As shown in FIGS. 16B and 16C, each of package components 34 is shifted slightly in +X direction or −X direction relative to the underlying package component 34. The shifting is in an alternating pattern. For example, as shown in FIG. 16B, package component 34B is shifted toward −X direction relative to the underlying package component 34A (for example, by distance S1), and package component 34C is shifted toward +X direction relative to the underlying package component 34B (by distance Si or a different distance). Package component 34C is again shifted toward +X direction relative to the underlying package component 34B. With the shifting of package components 34, a portion of each of package components 34A, 34B, and 34C is exposed so that PFS 20 may be attached thereon.

Figure 16E:
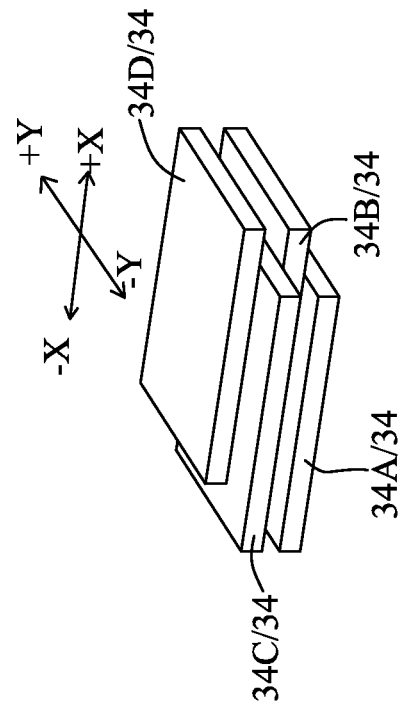
Figure 16D:
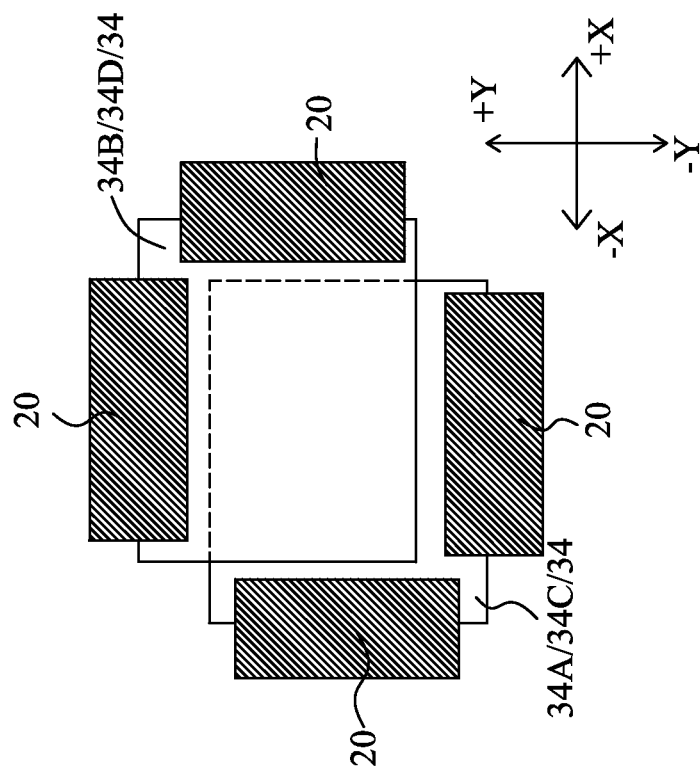

FIGS. 16D and 16E illustrate some examples for stacking package components 34, wherein FIGS. 16D and 16E include a top view and a perspective view, respectively. These embodiments are similar to the embodiments in FIGS. 16B and 16C, except that package components 34 are shifted slightly relative to the underlying package component 34 in two perpendicular directions. For example, package component 34B is shifted toward +X direction and +Y direction relative to the underlying package component 34A, and package component 34C (FIG. 16E) is shifted toward −X direction and −Y direction relative to the underlying package component 34B. With the shifting of package components 34 in each of the two perpendicular directions, two portions of each of package components 34 are exposed. Accordingly, two PFSs 20 (FIG. 16D) may be attached to each of package components 34A, 34B, and 34C.

Figure 17:
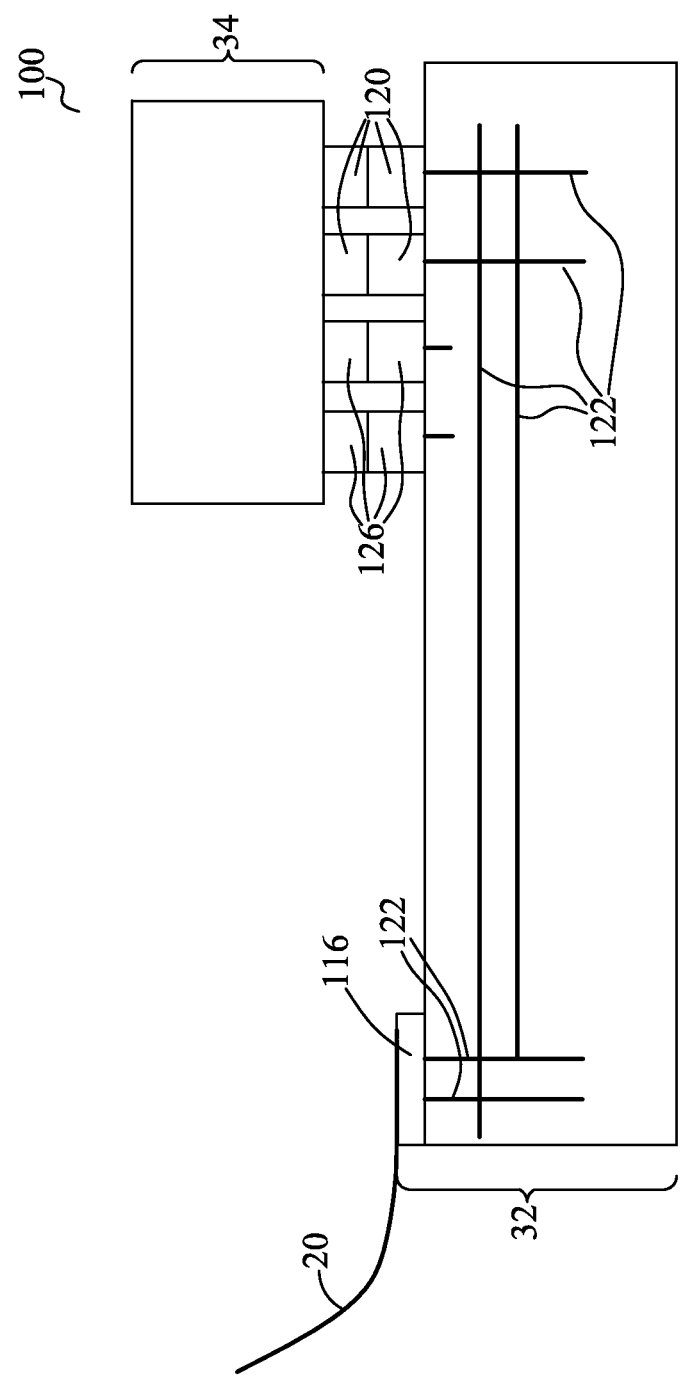
FIGS. 17 and 18 illustrate cross-sectional views of some packages including thermal traces for conducting heat to PFS coils.

FIG. 17 illustrates a part of package 100 in accordance with some embodiments. Package component 34 is bonded to package component 32 through metal bumps 120, which are good thermal conductors. Thermal paths 122, which may be metal traces such as copper traces, are formed in package component 32, and connect metal bumps 120 to metal pad 116, which is formed on the top surface of package component 32. PFS 20 is further connected to metal pad 116. Metal bumps 120, thermal paths 122, metal pad 116, and PFS 20 form a good thermal path for conducting the heat in package component 34 out of the respective package through package component 32. In some embodiments, metal bumps 120 do not have electrical functions, and may be electrically floating or grounded. Accordingly, a plurality of metal bumps 120 may be connected to the same metal pad 116. Package components 32 and 34 may further include additional metal bumps 126 for conducting electrical signals and voltages.

Figure 18:
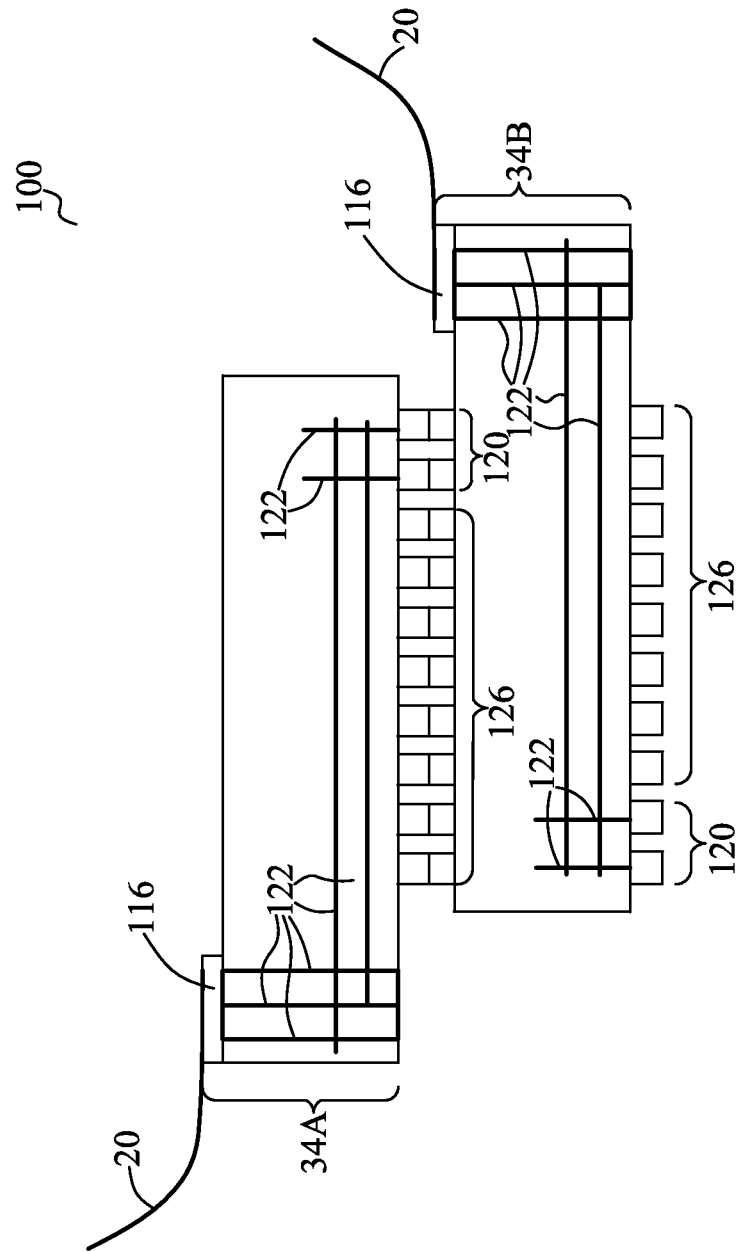

FIG. 18 illustrates a part of package 100 in accordance with yet alternative embodiments. In these embodiments, two package components 34A and 34B are bonded to each other through metal bumps 126. One or both of package components 34A and 34B further include metal bumps 120, which are used for conducting heat out of the respective package components 34. Metal bumps 120 in these embodiments may not be used for conducting electrical signals. One PFS 20 is connected to metal pad 116 of each of package components 34A and 34B.

Figure 19:
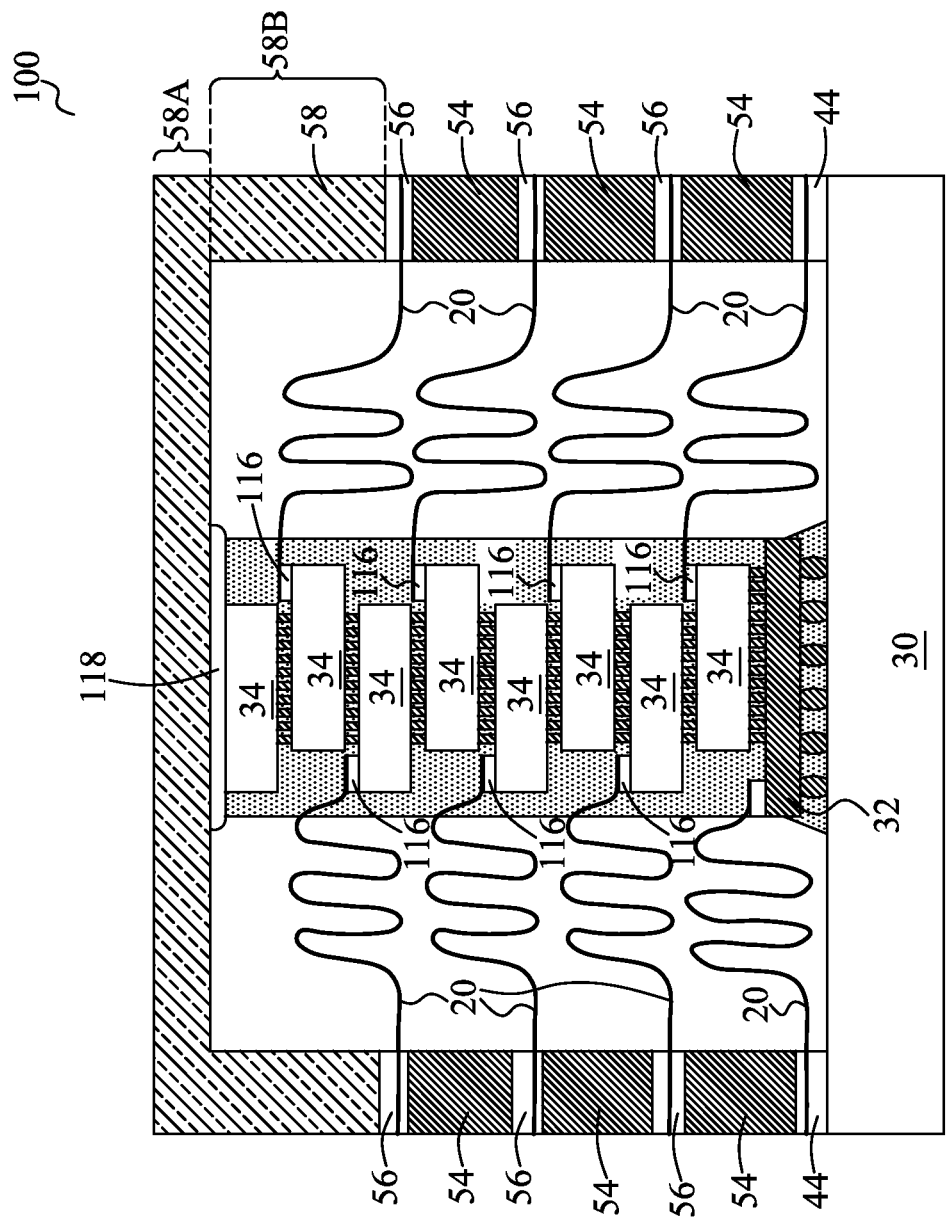
FIG. 19 illustrates a package in accordance with alternative embodiments.

FIG. 19 illustrates package component 100 in accordance with some embodiments, these embodiments are similar to the embodiments in FIG. 11A, except there are a plurality of levels of rings 54, which are stacked through adhesive layers 56. Furthermore, lid 58 may include top cover portion 58A, and ring portion 58B, wherein portions 58A and 58B may form an integrated unit.

Figure 20:
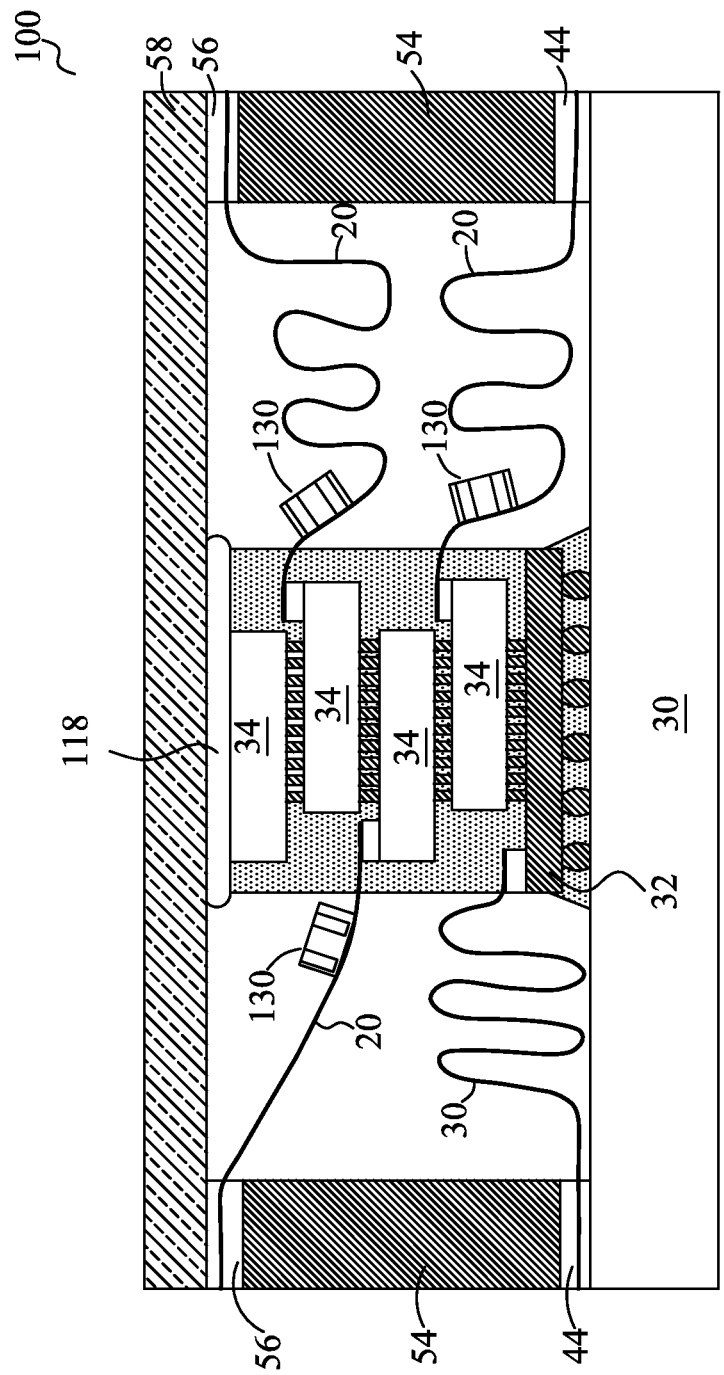
FIG. 20 illustrates a package including passive devices connected to PFS coils.

FIG. 20 illustrates package 100 including PFSs 20 for the heat conduction, and passive devices 130 connected to package components 34 through PFSs 20. Passive devices 130 may be capacitors, inductors, resistors, or the like. For example, Passive devices 130 may be decoupling capacitors for filtering the noise on power supply lines. In these embodiments, PFSs 20, besides the heat conducting function, are also used as electrical conductors.

Figure 21:
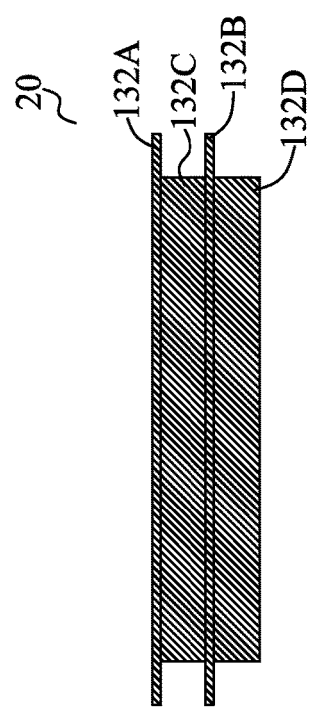
FIG. 21 illustrates a cross-sectional view of a PFS coil that may be used for attaching passive devices.

FIG. 21 illustrates a cross-sectional view of a portion of PFS 20 that may be used in the package shown in FIG. 20. In these embodiments, PFS 20 includes conductive sheet 132A, conductive sheet 132B, and dielectric material 132C between conductive sheets 132A and 132B. Conductive sheets 132A and 132B are thus electrically decoupled. In addition, dielectric sheet 132D may also be formed on a side of conductive sheet 132B opposite the side of dielectric sheet 132B. Each of conductive sheet 132A and conductive sheet 132B may be formed of copper, silver, gold, copper, aluminum, graphite and mixtures thereof, for example. Dielectric sheets 132C and 132D may comprise a polymeric material such as expanded polytetrafluoroethylene (PTFE), an insulation sheet formed by one or more layers of KAPTON™ (a trademark of E.I. Du Pont de Nemours and company), or a polyimide film. The conductive sheets with patterned conductive traces are provided between or on these insulation sheets to form data/signal lines.

Figure 22:
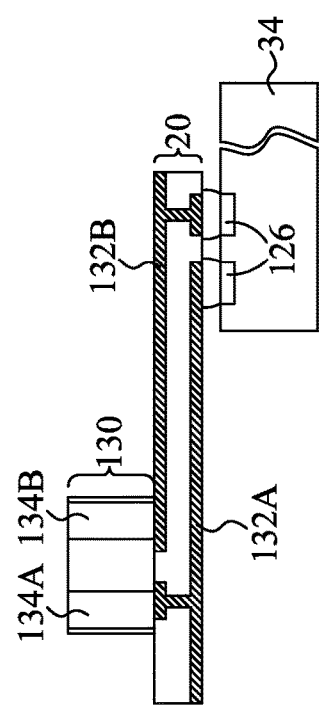
FIG. 22 illustrates a cross-sectional view of an attachment scheme for attaching a passive device onto a PFS coil.

FIG. 22 illustrates the connection of exemplary passive device 130 to PFS 20. Passive device 130 may be formed using Surface Mount Technology (SMT), and may be a capacitor, an inductor, or the like. For example, passive device 130 may be a Monolithic Ceramic Chip Capacitor (MLCC). In the embodiments passive device 130 is a capacitor, passive device 130 includes capacitor plates 134A and 134B, which are connected to conductive sheets 132A and 132B, respectively. The other ends of conductive sheets 132A and 132B are connected to metal bumps 126 of package component 34. In some embodiments, one of conductive sheets 132A and 132B is connected to power supply voltage VCC (also sometimes referred to as VDD), and the other one of conductive sheets 132A and 132B is connected to the electrical ground. The respective passive device 130 may thus be used as a decoupling capacitor.

In accordance with embodiments, a structure includes a thermal interface material, and a PFS including through-openings therein, with a first portion of the PFS embedded in the thermal interface material. An upper layer of the thermal interface material is overlying the PFS, and a lower layer of thermal interface material is underlying the PFS. The thermal interface material fills through-openings in the PFS.

In accordance with other embodiments, a structure includes a package component, a device die bonded over the package component, and a lid having a portion overlapping the device die. A PFS includes a first portion between the device die and the lid. The PFS includes a through-opening therein. A thermal interface material includes a first portion filling the through-opening, and a second portion overlying or underlying the PFS. The second portion is in contact with a top surface or a bottom surface of the PFS.

In accordance with yet other embodiments, a method includes dispensing a first thermal interface material over a device die, and placing a first portion of a PFS overlying the first thermal interface material. The PFS includes a through-opening therein. A second thermal interface material is dispensed over the PFS and the first thermal interface material. The second thermal interface material fills the through-opening. The PFS has a thermal conductivity higher than thermal conductivities of the first thermal interface material and the second thermal interface material.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A structure comprising:
   an integrated circuit package;
   a thermal interface material over the integrated circuit package;
   a Perforated Foil Sheet (PFS) over the thermal interface material, wherein the PFS comprises through-openings therein, with a first portion of the PFS embedded in the thermal interface material;
   a metal ring encircling the thermal interface material; and
   an adhesive layer underlying and attached to the metal ring, wherein the PFS comprises an end embedded in the adhesive layer.

2. The structure of claim 1, wherein the PFS comprises a first surface contacting the thermal interface material.

3. The structure of claim 2, wherein the PFS further comprises a second surface contacting the thermal interface material, wherein the first surface and the second surface are opposite surfaces of the PFS.

4. The structure of claim 1, wherein the thermal interface material comprises portions on opposite sides of the first portion of the PFS and interconnected through a portion of the thermal interface material filled in the through-opening of the PFS.

5. The structure of claim 1, wherein the PFS further comprises a second portion outside of the thermal interface material.

6. The structure of claim 1, wherein the integrated circuit package comprises a device die, with the thermal interface material in contact with the device die.

7. The structure of claim 1 further comprising:
   a metallic lid overlying and in contact with a top surface of the thermal interface material.

8. A structure comprising:
   a device die;
   a Perforated Foil Sheet (PFS) comprising:
      a first portion, wherein the PFS comprises a through-opening in the first portion; and
      a second portion;
   a thermal interface material comprising:
      a first portion filling the through-opening; and
      a second portion between and contacting a back surface of the device die and the PFS, wherein the second portion of the PFS is not in contact with the thermal interface material; and
   an adhesive layer contacting the second portion of the PFS, with the adhesive layer having a thermal conductivity lower than a thermal conductivity of the thermal interface material.

9. The structure of claim 8 further comprising:
   a metal ring encircling the device die, wherein the adhesive layer is underlying and attached to the metal ring.

10. The structure of claim 8, wherein the PFS further comprises a third portion between the first portion and the second portion of the PFS, with the third portion exposed to air.

11. The structure of claim 8 further comprising a molding compound, wherein the PFS further comprises a third portion between the first portion and the second portion of the PFS, with the third portion embedded in the molding compound.

12. The structure of claim 8, wherein the second portion of the PFS is suspended.

13. The structure of claim 8, wherein the thermal interface material further comprises a third portion over and contacting the PFS.

14. The structure of claim 13 further comprising a metal lid over and contacting the third portion of the thermal interface material.

15. A structure comprising:
    a package substrate;
    a device die over and electrically coupled to the package substrate;
    a Perforated Foil Sheet (PFS) comprising:
       a first portion directly over the device die; and
       a second portion vertically misaligned from the first portion;
    a thermal interface material comprising:
       a first portion penetrating through the PFS; and
       a second portion between and contacting the device die and the PFS, wherein the second portion of the PFS is further vertically misaligned from the thermal interface material;
    a thermally conductive ring overlying the package substrate, wherein the thermally conductive ring encircles the device die and the first portion and the second portion of the PFS; and
    a thermally conductive lid over the thermally conductive ring, wherein the thermally conductive lid, the thermally conductive ring, and package substrate define a space, and the device die and the first portion and the second portion of the PFS is in the space.

16. The structure of claim 15, further comprising a first pipe and a second pipe attached to the thermally conductive lid, wherein the space and additional spaces in the first pipe and the second pipe are interconnected to form a continuous space.

17. The structure of claim 15, wherein the thermal interface material further comprising a third portion over and contacting the first portion of the PFS.

18. The structure of claim 15, wherein the PFS further comprises a third portion overlapping, or overlapped by, the thermally conductive ring.

19. The structure of claim 18, wherein the PFS is an integral piece, and the first portion, the second portion, and the third portion of the PFS are portions of the integral piece.

20. The structure of claim 15, wherein the PFS further comprises an additional portion not in contact with the thermal interface material.

* * * * *